United States Patent
Amit et al.

(10) Patent No.: US 7,290,235 B2
(45) Date of Patent: Oct. 30, 2007

(54) METHOD AND SYSTEM FOR EMBEDDING WIRE MODEL OBJECTS IN A CIRCUIT SCHEMATIC DESIGN

(75) Inventors: Niv Amit, Givat Shmuel (IL); Ronit Bustin, Ra'anana (IL); Lidor Goren, Netanya (IL); Omer Heymann, Tel Aviv-Jaffa (IL); Moshe Leibowitz, Haifa (IL); Gil Noy, Ramat Gan (IL); Alex Raphayevich, Kiryat Ekron (IL); Maya Speiser, Tel Aviv-Jaffa (IL)

(73) Assignee: International Business Machines Corporation, Armonk, NY (US)

( * ) Notice: Subject to any disclaimer, the term of this patent is extended or adjusted under 35 U.S.C. 154(b) by 93 days.

(21) Appl. No.: 11/232,745

(22) Filed: Sep. 22, 2005

(65) Prior Publication Data

US 2007/0067749 A1   Mar. 22, 2007

(51) Int. Cl.
    G06F 17/50   (2006.01)
(52) U.S. Cl. .................... 716/12; 716/5; 716/6; 716/11
(58) Field of Classification Search ................ 716/12, 716/11, 5, 6
    See application file for complete search history.

(56) References Cited

U.S. PATENT DOCUMENTS

| | | | |
|---|---|---|---|
| 4,698,760 A | 10/1987 | Leback et al. | 716/6 |
| 4,924,430 A | 5/1990 | Zasio et al. | 716/6 |
| 5,274,568 A | 12/1993 | Blinne et al. | 716/6 |
| 5,572,437 A | 11/1996 | Rostoker et al. | 716/18 |
| 5,617,325 A | 4/1997 | Scheafer | 716/6 |
| 5,841,672 A | 11/1998 | Spyrou et al. | 716/6 |
| 5,875,114 A | 2/1999 | Kagatani et al. | 716/6 |
| 6,080,201 A | 6/2000 | Hojat et al. | 716/10 |
| 6,189,131 B1 | 2/2001 | Graef et al. | 716/8 |
| 6,317,861 B1 | 11/2001 | Hasegawa | 716/6 |
| 6,463,567 B1 | 10/2002 | Kozai | 716/2 |
| 6,532,577 B1 | 3/2003 | Mbouombouo | 716/6 |
| 6,581,195 B2 | 6/2003 | Tanaka | 716/5 |
| 6,880,141 B1 | 4/2005 | Tetelbaum | 716/6 |
| 7,159,202 B2 * | 1/2007 | Lee et al. | 716/11 |
| 2002/0056070 A1 | 5/2002 | Tanaka | 716/2 |
| 2004/0111688 A1 | 6/2004 | Lee et al. | 716/12 |
| 2004/0216062 A1 | 10/2004 | Fan | 716/5 |

FOREIGN PATENT DOCUMENTS

WO    WO03075189 A2    9/2003

OTHER PUBLICATIONS

Burstein et al., "Timing-influenced layout design", IBM Technical Disclosure Bulletin, vol. 28, No. 11, Apr. 1986.
Luitjen, "Time-driven CMOS gate placement", IBM Technical Disclosure Bulletin, vol. 33, No. 1A, Jun. 1990.

* cited by examiner

Primary Examiner—Sun James Lin
(74) Attorney, Agent, or Firm—Suzanne Erez

(57) ABSTRACT

The present invention is a method and system for schematically embedding wire model objects into a schematic design of an integrated circuit. The method includes estimating a wiring routing geometry for each signal path in the circuit, selecting one or more cascading wire model objects ("WMOs") for each segment in each geometry, and substituting each signal path with the respective one or more WMOs.

18 Claims, 4 Drawing Sheets

METHOD AND SYSTEM FOR EMBEDDING WIRE MODEL OBJECTS IN A CIRCUIT SCHEMATIC DESIGN

FIELD OF THE INVENTION

The present invention relates generally to the field of integrated circuit schematic and layout design. More specifically, the present invention relates to a method and system for embedding wire model objects in a circuit's schematics.

BACKGROUND

Typically, electrical circuits consist of a variety of components, for example, resistors, capacitors, inductors, diodes and transistors. In designing an electrical circuit, the circuit is expected to satisfy certain user-specified requirements. The creation of a complex circuit may involve creation of a topology, component sizing and placement, and also routing of wires that interconnect the circuit's components.

By 'topology' is generally meant the number and type of components (e.g., resistors, transistors, diodes). Topology of a circuit may include a list that may include information about connection that exists, in the schematic sense, between any two particular leads of components. By 'sizing' is meant assigning values to the circuit's components. By 'placement' is meant assignment of each of the circuit's components to a particular physical location on, e.g., a printed circuit board or a silicon wafer. By 'routing' is meant assignment of a particular physical location to the interconnection of wires between the leads of the circuit's components.

The exact physical location of each component and wire may affect the overall behavior of all circuits to some extent because electrical components and wires may have interactions with one another based on their physical location. These interactions, generally called parasitic effects, are generally small and may not be important to the performance of 'simple' circuits operating at relatively low frequencies. In such cases, parasitic effects may simply be factored out. By 'parasitic effect' is meant undesired effect that may be caused by capacitance, resistance, and sometimes inductance, which are introduced by interconnecting wires.

However, parasitic effects may detrimentally affect the performance of a more complex circuit or a circuit operating at relatively high frequencies, for example, at radio frequencies ("RF"). Under such circumstances, it may be impossible to design a practical circuit without factoring in parasitic effects.

Interconnection wirings may affect different circuits in different ways. For example, synchronization is essential for the proper functionality of many digital circuits. However, 'bad' wiring routing may 'force' the circuit out of synchronization, for example it may undesirably affect the propagation time of an electrical signal between circuit's devices along a certain signal path.

With the ongoing miniaturization of semiconductor devices and integrated circuits into the nanometer domain in past years, the problem of parasitic effects becomes more and more important in circuit design. This is due to the fact that at smaller scales, previously unimportant parasitic effects are now magnified. Therefore, when designing microelectronic circuit, a microelectronics engineer has an additional task, which is to find ways to minimize and overcome these effects while always delivering smaller and faster circuits.

In order to minimize and properly handle parasitic effects, they have to be evaluated first. This is done by use of wire model objects, which are sometimes referred to in the field as 'delay models'. Wire model objects are useful for timing analysis, which is required to evaluate the functionality of the designed circuit at high operating frequencies in the schematic level. However, traditional time-wise simulation applications are incapable of automatically generating a full-modeled circuit's schema in which essentially every wire and "via" connection is replaced with a corresponding wire model object ("WMO") and the WMOs are seamlessly 'fitted' into the schematic design of the full custom circuit.

Therefore, a need exist for a method for embedding wire model objects into schematic design of full custom circuits, for allowing comprehensive timing analysis in respect thereof.

SUMMARY OF THE INVENTION

According to some embodiments of the present invention there is provided a method and a system for embedding wire model objects into an original circuit schematic designs. According to further embodiments of the present invention, the circuit schematic with the embedded wire model may be used for timing analysis.

As part of the present invention the method may comprise: estimating a wiring routing geometry for each signal path in the circuit; selecting one or more cascading wire model objects ("WMOs") for each segment in each geometry; and substituting each signal path with the respective one or more WMOs.

According to some embodiments of the present invention, the method may further comprise deriving from a first (i.e., from the original) schematic design file of the circuit a second (i.e., equivalent) schematic design file by inserting one or more wire model objects ("WMOs") between devices/components of the circuit.

According to some embodiments of the present invention, a computer program product may also be provided by the present invention to generate a schematic representation of a designed circuit as an input to perform timing analysis of the design. The computer program product may also comprise a computer useable medium that includes a computer readable program. The computer readable program, when executed on a computer, may cause the computer estimate a wiring routing geometry for each signal path in the circuit; select one or more cascading wire model objects ("WMOs") for each segment in each geometry and to substitute each signal path with the respective one or more WMOs.

According to some embodiments of the present invention, a system is also provided for embedding wire model objects into original circuit schematic design, for allowing a timing analysis.

In its broadest sense, the system comprises a wire model embedder ("WME") for deriving from a first (i.e., the original) schematic design file of the full custom circuit a second (i.e., equivalent) schematic design file by inserting one or more wire model objects ("WMO's") between devices of the circuit. The system may further comprise an input memory for storing therein, inter alia, the first schematic design file, the content of which may contain data relating to the physical geometry of wiring routing of essentially every signal path's in the circuit, and to the original logical connectivity within the circuit. The geometry may be defined by a cluster consisting of one or more source and target points, and by line segments that interconnect these points.

BRIEF DESCRIPTION OF THE DRAWINGS

The subject matter regarded as the invention is particularly pointed out and distinctly claimed in the concluding portion of the specification. The invention, however, both as to organization and method of operation, together with objects, features, and advantages thereof, may best be understood by reference to the following detailed description when read with the accompanying drawings in which:

FIGS. 3a to 3e exemplify substitution of the wire routing geometry, as well as "via" connections and input impedances (of the gates of FIG. 1), with corresponding wire model objects according to some embodiments of the present invention;

Figure 1:
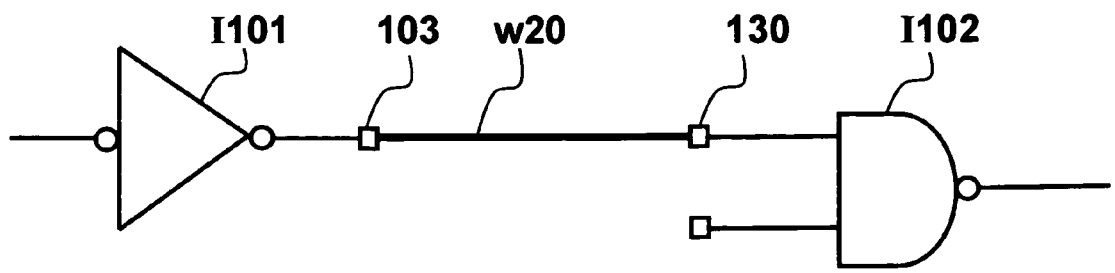
FIG. 1 shows an exemplary logic interconnection between two circuit devices (i.e., logic gates)

It will be appreciated that for simplicity and clarity of illustration, elements shown in the figures have not necessarily been drawn to scale. For example, the dimensions of some of the elements may be exaggerated relative to other elements for clarity. Further, where considered appropriate, reference numerals may be repeated among the figures to indicate corresponding or analogous elements.

DETAILED DESCRIPTION

In the following detailed description, numerous specific details are set forth in order to provide a thorough understanding of the invention. However, it will be understood by those skilled in the art that the present invention may be practiced without these specific details. In other instances, well-known methods, procedures, components and circuits have not been described in detail so as not to obscure the present invention.

Unless specifically stated otherwise, as apparent from the following discussions, it is appreciated that throughout the specification discussions utilizing terms such as "processing", "computing", "calculating", "determining", or the like, refer to the action and/or processes of a computer or computing system, or similar electronic computing device, that manipulate and/or transform data represented as physical, such as electronic, quantities within the computing system's registers and/or memories into other data similarly represented as physical quantities within the computing system's memories, registers or other such information storage, transmission or display devices.

Embodiments of the present invention may include apparatuses for performing the operations herein. This apparatus may be specially constructed for the desired purposes, or it may comprise a general purpose computer selectively activated or reconfigured by a computer program stored in the computer. Such a computer program may be stored in a computer readable storage medium, such as, but is not limited to, any type of disk including floppy disks, optical disks, CD-ROMs, magnetic-optical disks, read-only memories (ROMs), random access memories (RAMs), read-only memories (EPROMs), electrically erasable and programmable read only memories (EEPROMs), magnetic or optical cards, or any other type of media suitable for storing electronic instructions, and capable of being coupled to a computer system bus.

The processes and displays presented herein are not inherently related to any particular computer or other apparatus. Various general purpose systems may be used with programs in accordance with the teachings herein, or it may prove convenient to construct a more specialized apparatus to perform the desired method. The desired structure for a variety of these systems will appear from the description below. In addition, embodiments of the present invention are not described with reference to any particular programming language. It will be appreciated that a variety of programming languages may be used to implement the teachings of the inventions as described herein.

FIG. 1 exemplifies a logic interconnection (w20) between two circuit devices (i.e., logic gates 101 and 102). A first (i.e., original) schematic design file of a full custom circuit may be obtained from external source, or the file may be created using known full custom circuit designing tools. The sub-circuit of FIG. 1 may be a part of the full custom circuit. The original full custom circuit design file may typically include data pertaining to all the circuit devices. For example, the data may relate to identity ("ID") names and electrical models of capacitors, resistors, logic gates (such as gates 101 and 102), names of signals and circuit schematic nodes (e.g., nodes 103, I129, and I130), and logic connections between the various nodes (e.g., logic connection w20). Node 103 may be regarded as source point/node in respect to the signal it outputs towards gate 102. Node I130 may be regarded as target point/node, as the signal outputted from gate 101 is intended for gate 102.

In order to evaluate the delay imposed by parasitic effects on the signal forwarded from gate 101 to gate 102, it is necessary to perform comprehensive timing analysis in respect of that signal. The comprehensive timing analysis in respect of that signal involves evaluation of parasitic effects associated with the gates themselves (i.e., the output and input impedances of gates 101 and 102 respectively) and the wire interconnecting these gates (i.e., the wire associated with logic connection w20).

Because of physical, and possibly other, constraints, different segments of an interconnection wire are often fabricated on different layers of the substrate of the full custom circuit. These segments are connected to one another using "via" connections that pass through the layers. Therefore, it would be beneficial to factor in also parasitic effects associated with these "via" connections.

Figure 2:
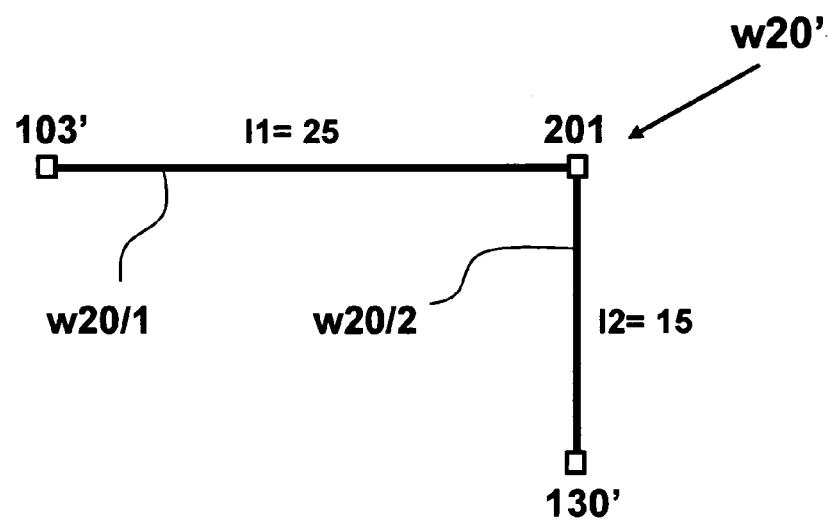
FIG. 2 shows an exemplary estimated wire routing geometry associated with the logic interconnection of FIG. 1.

FIG. 2 shows an exemplary estimated wire routing geometry (w20') associated with the logic interconnection w20 of FIG. 1. As mentioned hereinbefore, fabrication procedure of full custom circuits typically involves physical placement of the various circuit's devices and, then, assigning a physical path (i.e., routing) to wires between the devices according to the logical connections (e.g., w20) and design (e.g., physical) constraints.

Once the relative physical locations of gates 101 and 102 have been set (not shown), the logic connection w20 (between logical nodes 103 and I130), is 'translated' into corresponding planned wire routing, as exemplified in FIG. 2. Based on, or conforming to, the physical locations of gates 101 and 102, it may be estimated that the 'real' wire, which will interconnect these gates, will consist of two segments, w20/1 and w20/2, having ('real', or actual) lengths of 11=25 micrometer ($^{\mu m}$) and 12=15 $^{\mu m}$, respectively. It may also be anticipated that the segments w20/1 and w20/2 will be fabricated on different layers of the substrate, with a "via" connection interconnecting them to one another in the designated place 201. It may be predicted that segments w20/1 and w20/2 are vertically and horizontally oriented, respectively, or they may be angularly displaced from one another in accordance with various physical, and possibly other, constraints. Reference numerals 103 and 1130 refer to schematic, or logic, nodes, whereas reference numerals 103' and 1130' refer to physical nodes associated with the circuit logic nodes 103 and 1130, respectively.

A second (i.e., equivalent) schematic design file may be derived from the first schematic design file by inserting one or more wire model objects ("WMOs) between devices of the circuit. In respect of the exemplary gates 101 and 102 (FIG. 1) and the wire interconnecting them (FIG. 2), the WMOs may be inserted by first associating the signal name of interest, designated 'net093' (associated with logic connection w20), to its estimated wiring routing geometry, w20/1 and w20/2. One or more WMOs may then be selected for these segments such that the WMOs may be associatively coupled to one another in the order of the consecutive wire segments, w20/1 → w20/2, and also to the source point (103, FIG. 1) and destination point (1130, FIG. 1) of the signal.

FIGS. 3a to 3e exemplify substitution of the wire routing geometry, as well as "via" connections, with corresponding WMOs according to some embodiments of the present invention.

The WMOs may be selected from a library of WMOs based on a wire modeling strategy. A wire model object generator that estimates wiring routing geometries and generates corresponding WMOs according to a chosen wire modeling strategy is described in a co-pending patent application of the same applicant. Briefly, the co-pending patent application discloses a method for modeling an interconnection wiring routing having a geometry defined by a cluster consisting of one or more source points and one or more target points and segments interconnecting these points. Sequential segments' length are summed up along one or more, not overlapping, paths between corresponding pairs of points, and, for each pair of points, a wire model object is seamlessly inserted therebetween, in the schematic sense, based on the signal's path length and on a predefined set of selection rules.

Referring now to FIGS. 3b and 3d, wire segments w20/1 and w20/2 are replaced with corresponding WMOs (designated 'M1' and 'M2', respectively). M1 and M2 symbolically represent corresponding resistor-capacitor ("RC") arrangements that reflect parasitic effects of wire segments w20/1 and w20/2. M1 and M2 are schematically inserted between the circuit devices, gates 101 and 102 in this example. The length of wire segments w20/1 and w20/2 plays a major role in selecting the WMOs. However, other criterions may be factored in as well for selecting WMOs, as described in the co-pending patent application mentioned before.

Referring now to FIG. 3c, R2 represents the parasitic effect of the "via" connection 201 (FIG. 2). In this case, the parasitic effect is simply represented by one resistor (i.e., R2=0.002 ohm). In other cases, however, a complex RC arrangement may represent parasitic effect of via connections.

Figure 3E:
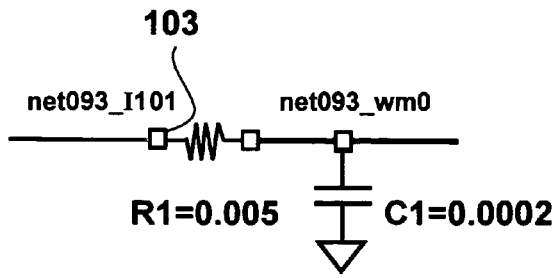
Figure 3E:
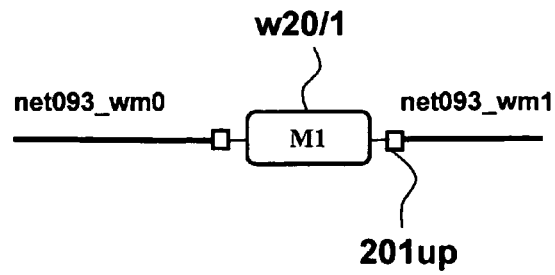
Figure 3E:
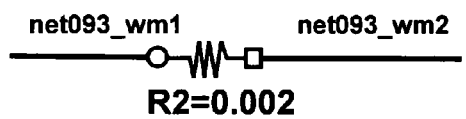
Figure 3E:
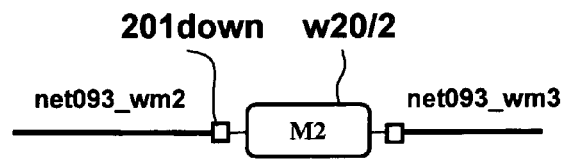
Figure 3E:
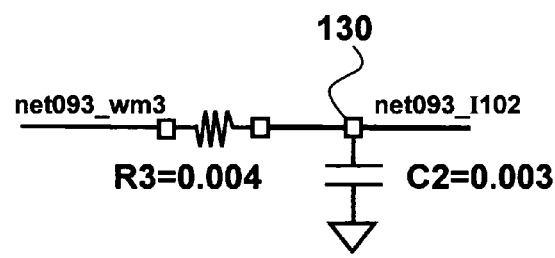

Turning now to FIGS. 3a and 3b, the parasitic effect caused by the respective "via" connections at the output of gate I101 and the input of gate I102 (FIG. 1) are shown represented by RC arrangement consisting of R1 and C1, and R3 and C2, respectively. All resistors' and capacitors' values in FIGS. 3a, 3c and 3e are given in 'ohms' and 'microfarads', respectively. It is noted that the RC arrangements shown in FIGS. 3a and 3e may be replaced by symbols similar to symbol M1 or M2.

The association between one WMO to another and between WMOs to source points, such as source point 103, and target points, such as target point 130, is made using connection labels. That is, the input/output ("I/O") terminals in the circuit and terminals of the WMOs belonging to the same circuit node are assigned a common connection label to logically interconnect these terminals to one another.

Turning again to FIG. 1 and FIGS. 3a to 3e, the input and output terminals of the first WMO (FIG. 3a) are assigned, or annotated by, exemplary labels 'net093_I101'and 'net093_wm0', respectively. The annotation 'net093_' refers to the specific network the signal of interest belongs to. The annotation '_I101' refers to the schematic output terminal of gate 101. The annotation '_wm' refers generally to a wire model and '0' stands for the schematic node following the previous node (i.e., I101, in this example).

Likewise, the input and output terminals of the second WMO (FIG. 3b) are assigned, or annotated using, exemplary labels 'net093_wm0' and 'net093_wm1', respectively. The annotation '1' (in 'net093_wm1') refers to the schematic node following the previous node (i.e., '0', in this example).

Likewise, the input and output terminals of the third WMO (FIG. 3c) are assigned, or annotated using, exemplary labels 'net093_wm1' and 'net093_wm2', respectively. The annotation '2' (in 'net093_wm2') refers to the schematic node following the previous node (i.e., '1', in this example).

Likewise, the input and output terminals of the fourth WMO (FIG. 3d) are assigned, or annotated using, exemplary labels 'net093_wm2' and 'net093_wm3', respectively. The annotation '3' (in 'net093_wm3') refers to the schematic node following the previous node (i.e., '2', in this example).

Likewise, the input and output terminals of the fifth WMO (FIG. 3e) are assigned, or annotated using, exemplary labels 'net093_wm3' and 'net093_I130', respectively. The annotation 'I130' (in 'net093_I130') refers to the schematic node following the previous node (i.e., '3', in this example).

The WMOs are associatively arranged one after another, according to the signal flow path, as implied by the ordered connection labels (i.e., notations): 'net093_I101' → 'net093_wm0' → 'net093_wm1' → 'net093_wm2' → → 'net093_wm3' → 'net093_I102'.

In respect of "via" connection 201, it is shown (in FIGS. 3b and 3d) 'split' into an upper node, 201 up, and a lower node, 201 down, because it is assumed that wire segment w20/1 is estimated to be located at a higher layer than wire segment w20/2. Accordingly, R2 (FIG. 3c) will be associatively inserted between nodes 201 up and 201 down, by using corresponding connection labels.

The second (i.e., equivalent) schematic design file may contain data relating to the WMOs and to the connection labels. The second schematic design file may also contain a list of all the associations between all terminals, nodes and connection labels. Terminals having the same label are considered connected to the same schematic node. For example, the output terminal of the third WMO (FIG. 3c) and the input terminal of the fourth WMO (FIG. 3d) are considered connected to the same schematic node because they are assigned a common connection label, 'net093_wm2'.

The equivalent schematic design file may be displayed on a computer display. In particular, an equivalent schematic design may be displayed (using the equivalent file), which may include original circuit devices with the WMOs inserted between them. By 'insertion' is meant either associatively or graphically. That is, WMOs may each be displayed in another part of the display and only be associated with other WMOs, terminals and nodes based on listed connection labels. Alternatively, the WMOs, or some of them, may be displayed as being graphically inserted between circuit devices, in addition to them being associatively connected.

Each signal path of interest in the second schematic design representation may be traceable by navigating from one circuit's node to another by using (such as by 'clicking' or touching) connection labels associated with the signal path.

Once WMOs have been automatically selected for all or some of the logic connections, "via" connections and gates, and associated with the corresponding nodes (based on the connection, or association, labels), the equivalent circuit design file may be utilized to analyze the circuit.

A computer program product is also provided by the present invention to generate a schematic representation of a circuit as an appropriate input for timing analysis of the design. The computer program product may comprise a computer useable medium that includes a computer readable program. The computer readable program, when executed on a computer, may cause the computer to derive an equivalent schematic design file from an original (i.e., first) schematic design file of a full custom circuit based on known wiring routing data associated with the original schematic design file. The computer readable program may derive the equivalent schematic file by inserting one or more wire model objects between devices within the circuit schematic design, based on the wiring routing geometry, and as described herein in respect of FIG. 1 and FIGS. 3a to 3e.

The method and computer program product disclosed by the present invention may allow 'turning' essentially any given circuit schematic design into a schematic that can undergo a full scale, accurate and comprehensive timing analysis.

Figure 4:
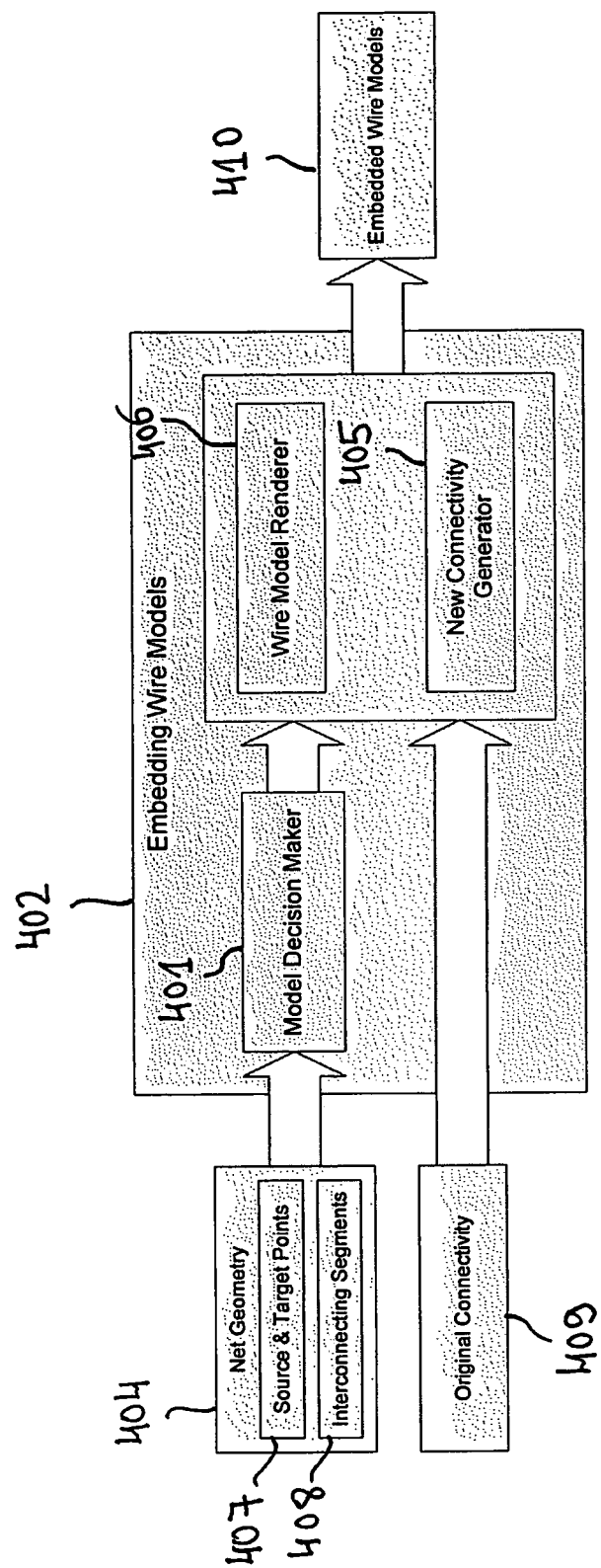
FIG. 4 schematically illustrates the general layout and functionality of the system according to some embodiments of the present invention.

FIG. 4 schematically illustrates the general layout and functionality of the system according to some embodiments of the present invention. The system may also comprise a wire model embedder ("WME") 402 for deriving from a first (i.e., the original) schematic design file of the full custom circuit a second (i.e., equivalent) schematic design file by inserting one or more wire model objects ("WMOs") between devices of the circuit. The system may further comprise an input memory 404 and 409 for storing therein, inter alia, the first schematic design file, the content of which may relate to the physical geometry of wiring routing of essentially every signal path in the circuit, and to the original logical connectivity of the circuit's components. The geometry may be defined by a cluster consisting of one or more source and target points (407), and by line segments that interconnect these points (408).

According to some embodiments of the present invention, the WME 402 may comprise a model decision maker ("MDM") 401 for deciding the number and type of WMOs a segment should be substituted with. The WME 402 may also comprise a wire model renderer ("WMR") 406 for inserting the WMOs by associating each signal name in the circuit to its estimated wiring routing, which may consist of one or more consecutive segments. Then, the MDM 401 may select one or more WMOs for the geometry segment(s) and associatively couple the WMOs to one another and to the originating (i.e., source) and destination (i.e., target) points (407) of the signal. The WME 402 may comprise a new connectivity generator ("NCG") 405 for generating the second schematic design file.

The MDM 401 may model the wiring routing geometry stored in the input memory in whole or in part, by replacing, in the schematic sense, one segment or a group of sequential segments (408), with WMOs, or by replacing the entire wire routing geometry with one WMO. The MDM 401 may replace the entire routing geometry or only segment(s) thereof based on a predefined set of wire model objects and predefined selection rules. The system may further comprise an output memory 410 for storing therein the resulting second schematic file.

Figure 5:
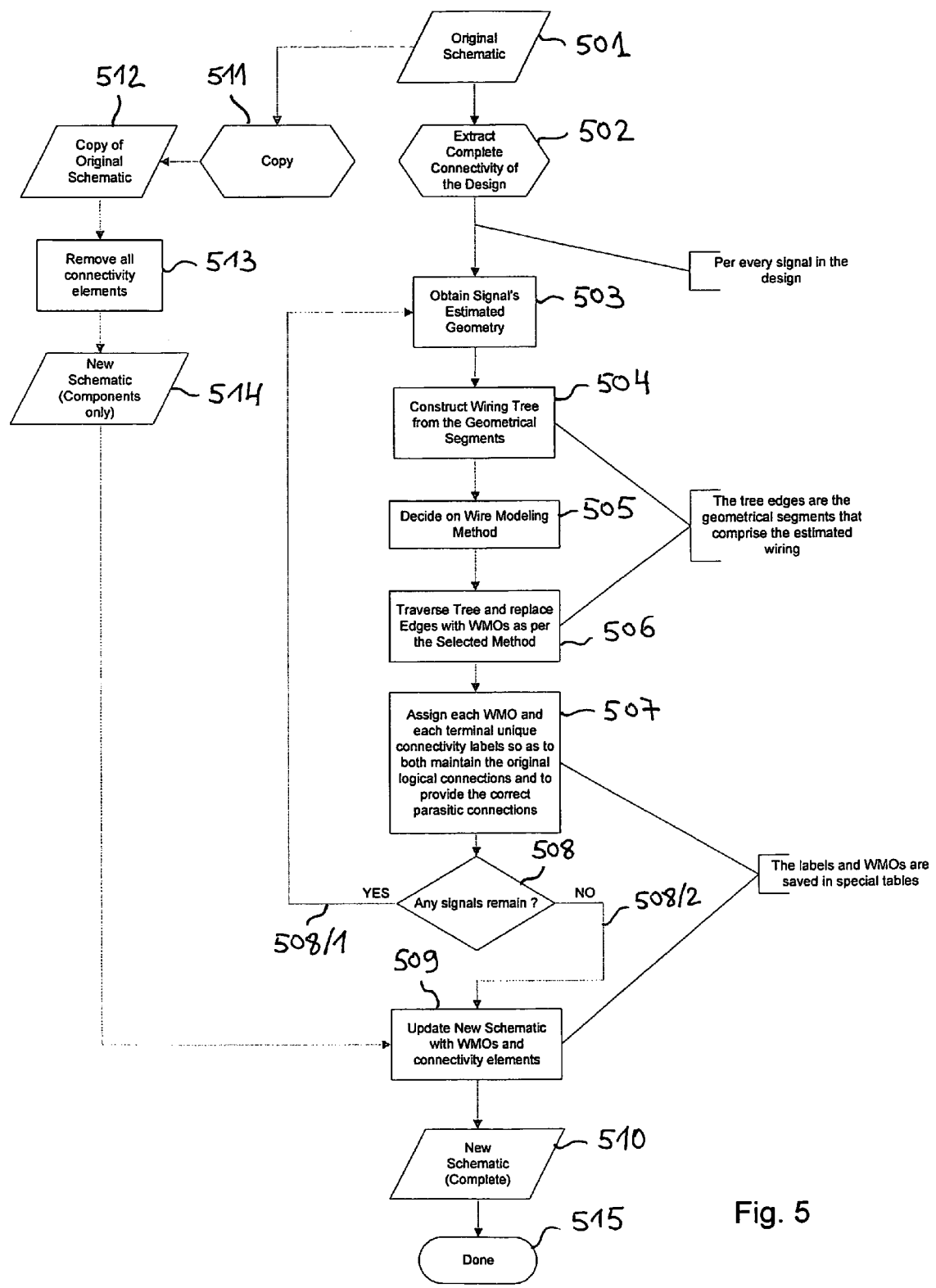
FIG. 5 shows a flowchart according to some embodiments of the present invention.

FIG. 5 shows a flowchart according to some embodiments of the present invention. At step 502, the entire logical connectivity of the circuit is extracted from the first (i.e., original) schematic design file relating to the circuit at. At step 503, an estimated routing geometry is obtained for one or more signals in the circuit based on a given cluster of source and target points associated with the signal. At step 504, a wiring tree is constructed from the geometrical segments, and a decision is made, at step 505, as to the wire model strategy that is to be adopted in respect of the specific circuit.

According to some embodiments of the present invention, once the wire model strategy is decided (at step 505), the geometry segments are each substituted, in the schematic sense, with one or more WMOs. Then, at step 507, each WMO and terminal is assigned unique connectivity labels such that every WMO and terminal relating to a common signal is assigned the same connectivity label.

According to further embodiments of the present invention, if a signal is left unhandled, steps 503 to 507 are repeated (508/1) in respect of that signal. By 'left unhandled' is meant a signal whose associated geometry segments have not been yet substituted by corresponding WMOs. If, however, all signals have been handled (508/2), a new (i.e., equivalent, or second) schematic file is created, at step 510, and completed, at step 510.

The second schematic design file may be derived from the first schematic design file as follows. A copy of the first file may be made, at steps 511 and 512, and all the logical connectivity segments may be removed, at step 513, to 'make room' for corresponding WMOs substitutions (step 513), whereby to obtain an initially 'clean' version of the second file. By 'initially ' 'clean' 'version' is meant a file containing only data related to the circuit components. The 'vacant' places are then 'filled in' with corresponding WMO's based on the connectivity labels; that is, terminals of component(s) and/or WMO(s) that are assigned a common connectivity label (i.e., they belong to the same signal path) is logically connected to the same circuit node.

While certain features of the invention have been illustrated and described herein, many modifications, substitutions, changes, and equivalents will now occur to those skilled in the art. It is, therefore, to be understood that the appended claims are intended to cover all such modifications and changes as fall within the true spirit of the invention.

What is claimed is:

1. A method for schematically embedding wire model objects (WMOs) into a schematic design of an integrated circuit, comprising:

a) estimating a wiring routing geometry for each signal path in said integrated circuit and associating a signal path name to a respective estimated wiring routing geometry;

b) selecting one or more cascading WMOs for each segment in each estimated wiring routing geometry and associatively coupling said one or more cascading WMOs to one another and to source and target points of the respective signal path name; and c) substituting each signal path with said one or more cascading WMOs.

2. The method according to claim 1, comprising deriving, from a first schematic file relating to logical connections in the integrated circuit and to physical size of components of said integrated circuit, and from placement data relating to physical locations of said components, a second schematic file in which wire model objects are substituted for signal paths.

3. The method according to claim 2, wherein a second schematic design in the second schematic file is displayable on a computer display.

4. The method according to claim 3, wherein each signal path of interest in the second schematic design is traceable by navigating from one circuit'snode to another by using, clicking, or touching displayed connection labels associated with said each signal path.

5. The method according to claim 4, wherein discrete elements of the WMOs associated with the signal path of interest are displayable.

6. The method according to claim 4, wherein the WMOs associated with the signal path of interest are displayable as symbols.

7. The method according to claim 1, wherein associatively coupling said one or more cascading WMOs comprises using connection labels, wherein input/output terminals in the integrated circuit and terminals of the wire model objects belonging to the same circuit node are assigned a common connection label to logically interconnect said input/output terminals.

8. The method according to claim 1, wherein the estimated wiring routing geometry further comprises via connections, and a corresponding WMO is selected for each of said via connections.

9. A computer program product for schematically embedding wire model objects (WMOs) into a schematic design of an integrated circuit, comprising a computer useable medium that includes a computer readable program; said computer readable program, when executed on a computer, causes said computer to:

estimate a wiring routing geometry for each signal path in said integrated circuit and associate a signal path name to a respective estimated wiring routing geometry;

select one or more cascading WMOs for each segment in each estimated wiring routing geometry and associatively couple said one or more cascading WMOs to one another and to source and target points of the respective signal path name; and substitute each said signal path with said one or more cascading WMOs.

10. The computer program product according to claim 9, wherein associatively coupling said one or more cascading WMOs comprises using connection labels, wherein input/output terminals in the integrated circuit and terminals of the wire model objects belonging to the same circuit node are assigned a common connection label to logically interconnect said input/output terminals.

11. The computer program product according to claim 9, wherein said computer readable program, when executed on a computer, causes said computer to derive, from a first schematic file relating to logical connections in the integrated circuit and to physical size of components of said integrated circuit, and from placement data relating to physical locations of said component, a second schematic file in which wire model objects are substituted for signal paths.

12. A system for schematically embedding wire model objects (WMOs) into a schematic design of an integrated circuit, comprising:

a wire model embedder to estimate a wiring routing geometry for each signal path in said integrated circuit and associate a signal path name to a respective estimated wiring routing geometry; to select one or more cascading WMOs for each segment in each estimated wiring routing geometry and associatively couple said one or more cascading WMOs to one another and to source and target points of the respective signal path name; and to substitute each said signal path with said one or more cascading WMOs.

13. The system according to claim 12, wherein the wire model embedder derives from the schematic design file of the integrated circuit a second schematic design file wherein wire model objects are substituted for signal paths by schematically inserting said one or more cascading WMOs between components of said integrated circuit using common labels.

14. The system according to claim 12, comprising an input memory for storing therein a first schematic design flle including data relating to a physical geometry of wiring routing of essentially every signal path in the integrated circuit, and to original logical connectivity within the integrated circuit, said geometry being definable by a cluster consisting of one or more source and target points, and by line segments that interconnect these points.

15. The system according to claim 12, wherein the wire model embedder comprises:

a wire model renderer for estimating the wire routing geometries;

a model decision maker for selecting the WMOs each segment should be substituted with; and a new connectivity generator for substituting the signal paths with respective WMOs, whereby to derive a second schematic design file.

16. The system according to claim 15, comprising an output memory for storing therein the resulting second schematic design file.

17. The system according to claim 12, wherein the associatively coupling said one or more cascading WMOs comprises using connection labels, wherein input/output terminals in the integrated circuit and terminals of the wire model objects belonging to the same circuit node are assigned a common connection label to logically interconnect said input/output terminals.

18. The system according to claim 12, wherein the estimated wiring routing geometry further comprises via connections, and a corresponding WMO is selected for each of said via connections.

* * * * *